(12) United States Patent
Ker et al.

(10) Patent No.: US 7,138,804 B2
(45) Date of Patent: Nov. 21, 2006

(54) AUTOMATIC TRANSMISSION LINE PULSE SYSTEM

(75) Inventors: Ming-Dou Ker, Hsinchu (TW);
Chyh-Yih Chang, Hsinchu (TW);
Chun-Lin Hou, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/810,645

(22) Filed: Mar. 29, 2004

(65) Prior Publication Data
US 2005/0030043 A1 Feb. 10, 2005

Related U.S. Application Data

(60) Provisional application No. 60/493,355, filed on Aug. 8, 2003.

(51) Int. Cl.
*G01N 27/60* (2006.01)
*G01R 31/26* (2006.01)
(52) U.S. Cl. .................. 324/452; 324/768; 324/769
(58) Field of Classification Search ........ 324/763–769, 324/713, 719, 452–458; 702/118–121; 257/48
See application file for complete search history.

(56) References Cited

U.S. PATENT DOCUMENTS

| 4,823,088 | A | * | 4/1989 | Fukuda | 324/456 |
| 5,519,327 | A | * | 5/1996 | Consiglio | 324/678 |
| 5,561,373 | A | * | 10/1996 | Itoh | 324/158.1 |
| 5,576,557 | A | * | 11/1996 | Ker et al. | 257/173 |
| 5,675,260 | A | * | 10/1997 | Consiglio | 324/763 |
| 5,872,031 | A | * | 2/1999 | Mishra et al. | 438/216 |
| 6,541,981 | B1 | * | 4/2003 | Allard et al. | 324/458 |

OTHER PUBLICATIONS

Chen et al. "Investigation of the Gate-Driven Effect and Substrate Triggered Effect on ESD Robustness of CMOS Devices" Dec. 2002, IEEE Transactions on Device and Materials Reliability. vol. 1, No. 4; pp. 190-203.*
Barth et al. "TLP Calibration, Correlation, Standards, and New Techniques" Apr. 2001. IEEE Transactions on Device and Materials Reliability. vol. 24, No. 2; pp. 99-108.*
T. J. Maloney, et al. "Transmission Line Pulsing Techniques for Circuit Modeling of ESD Phenomena," 1985 EOS/ESD Symposium Proceedings, pp. 49-54.

* cited by examiner

*Primary Examiner*—Vincent Q. Nguyen
*Assistant Examiner*—Jeff Natalini
(74) *Attorney, Agent, or Firm*—Akin Gump Strauss Hauer & Feld, LLP (57) ABSTRACT

A system for measuring electrostatic discharge (ESD) characteristics of a semiconductor device that comprises at least one pulse generator generating ESD-scale pulses, a first point of the semiconductor device receiving a first ESD-scale pulse from the at least one pulse generator, a second point of the semiconductor device receiving the first ESD-scale pulse from the at least one pulse generator, at least a third point of the semiconductor device receiving a second ESD-scale pulse from the at least one pulse generator, and a data collector to collect data on the ESD characteristics of the semiconductor device.

35 Claims, 7 Drawing Sheets

AUTOMATIC TRANSMISSION LINE PULSE SYSTEM

This application claims priority to U.S. Provisional Application Ser. No. 60/493,355, filed Aug. 8, 2003, and is incorporated herein by reference.

DESCRIPTION OF THE INVENTION

1. Field of the Invention

This invention pertains in general to measurement of electrical characteristics of a semiconductor device and, more particularly, to systems and methods for measuring ESD characteristics in a semiconductor device.

2. Background of the Invention

A semiconductor integrated circuit ("IC") is generally susceptible to an electrostatic discharge ("ESD") event, which may damage or destroy the IC. An ESD event is an electrical discharge of a current (positive or negative) for a short duration during which a large amount of current is provided to the IC. The high current may be built-up from a variety of sources, such as the human body and machines, referred to as the human body model ("HBM") and machine model ("MM"), respectively. An IC is particularly susceptible to the HBM and MM built-up during fabrication, transportation, or handling.

Conventional ESD protection devices manufactured with complementary metal-oxide-semiconductor ("CMOS") processes generally include some type of ESD protection devices, such as NMOS/PMOS transistors, silicon-controlled rectifiers ("SCR"), field oxide devices ("FOD") and parasitic vertical/lateral bipolar junction transistors ("BJT"). These ESD protection devices may be turned on during an ESD event by an ESD detection circuit that couples a portion of the energy of an ESD pulse to a gate or substrate of the ESD protection device. Examples of circuit structures including an ESD protection device and an ESD detection circuit are shown in FIGS. 1A and 1B.

Figure 1A:
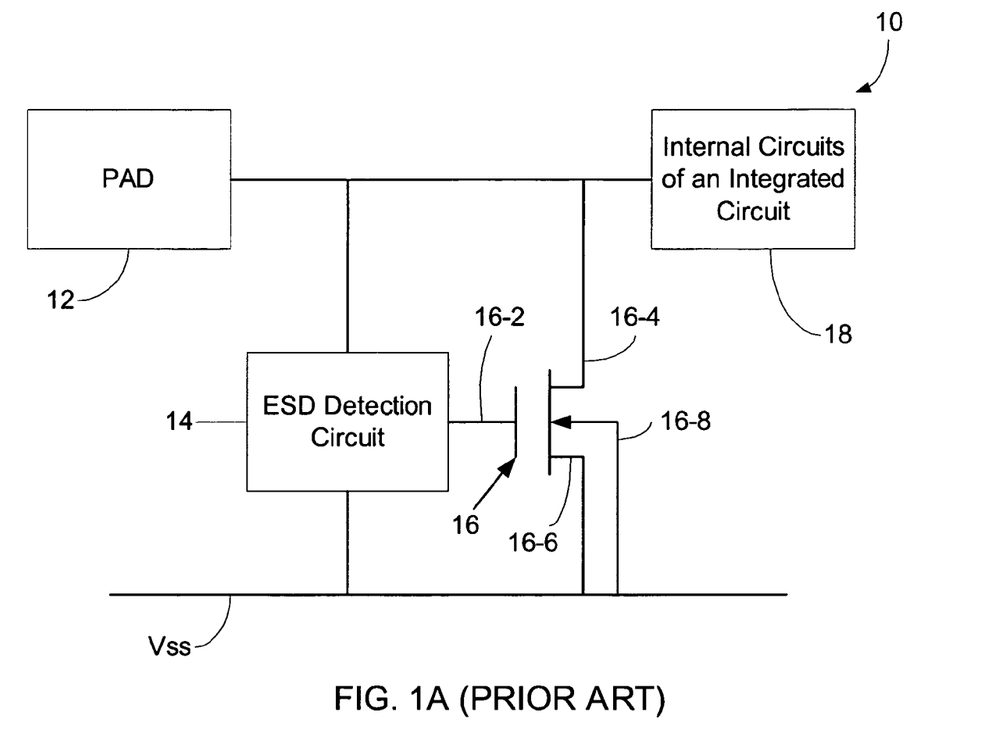
FIG. 1A is a circuit diagram of a conventional circuit structure for electrostatic discharge (ESD) protection using a gate-driven technique.

FIG. 1A is a circuit diagram of a conventional ESD protection circuit 10 using a gate-driven technique. Referring to FIG. 1A, circuit 10 includes a pad 12, an ESD detection circuit 14, an NMOS transistor 16 that serves as an ESD protection device, and internal circuits 18 of an IC (not numbered). ESD protection device 16 includes a gate 16-2, drain 16-4, source 16-6, and bulk 16-8. Gate 16-2 is coupled to ESD detection circuit 14. Drain 16-4 is coupled between pad 12 and internal circuits 18. Source 16-6 and bulk 16-8 are connected to ground or a reference voltage VSS. When a positive ESD pulse appears on pad 12, part of the energy of the ESD pulse is coupled by ESD detection circuit 14 to gate 16-2. ESD protection device 16 is then turned on to conduct the ESD current from pad 12 to the VSS power terminal.

Figure 1B:
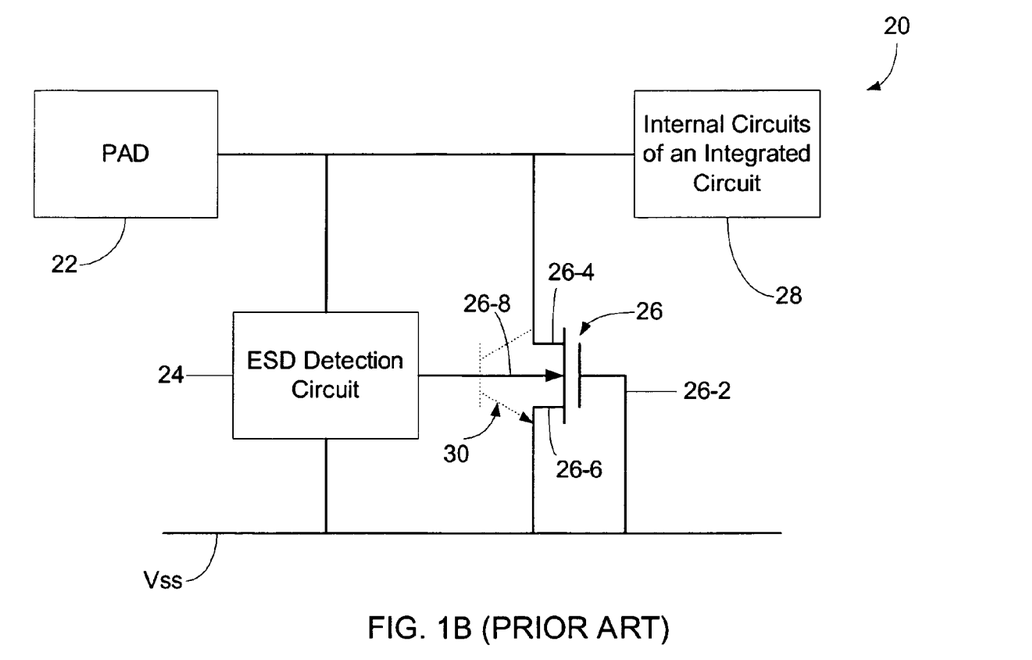
FIG. 1B is a circuit diagram of a conventional circuit structure for ESD protection using a substrate-triggered technique.

FIG. 1B is a circuit diagram of a conventional ESD protection circuit structure 20 using a substrate-triggered technique. Referring to FIG. 1B, circuit structure 20 includes a pad 22, ESD detection circuit 24, NMOS transistor 26 that serves as an ESD protection device, and internal circuits 28 of an IC (not numbered). ESD protection device 26 includes a gate 26-2, drain 26-4, source 26-6, and bulk 26-8. Gate 26-2 and source 26-6 are connected to ground or VSS. Bulk 26-8 is coupled to ESD detection circuit 24. Drain 26-4 is coupled between pad 22 and internal circuits 28. When a positive ESD pulse appears on pad 22, part of the energy of the ESD pulse is coupled by ESD detection circuit 24 to bulk 26-8. A parasitic lateral npn bipolar transistor 30 formed in ESD protection device 26 is turned on to conduct the ESD current from pad 22 to the VSS power terminal.

In designing an ESD protection circuit structure for an IC, ESD characteristics of an ESD protection device of the circuit structure are advantageously measured or tested before an ESD protection device is fabricated. The ESD characteristics of an ESD protection device generally are shown as a response of the ESD protection device to an ESD pulse. For example, it has been found in the art that an ESD protection device may sustain a higher ESD stress if the ESD protection device included a higher second breakdown current. ESD characteristics, such as the second breakdown current of an ESD protection device, may be measured by using a transmission line pulse ("TLP") technique that provides square wave pulses of the same time and current scale as an ESD event.

However, measurements of conventional testing systems using the TLP technique are generally taken at two points. Therefore, for example, if measurements are taken at the drain and source of an ESD protection device, the ESD characteristics at the gate or substrate would not be able to be taken conjunctively therewith. Since ESD characteristics of the gate and substrate are important in designing an ESD protection circuit structure as described above, it is desirable to have a system and a method for measuring at least three points of an ESD protection device to obtain more information regarding the ESD characteristics of the ESD protective device.

SUMMARY OF THE INVENTION

Accordingly, the present invention is directed to ESD protection devices that obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the devices and methods particularly pointed out in the written description and claims thereof, as well as the appended drawings.

To achieve these and other advantages, and in accordance with the purpose of the invention as embodied and broadly described, there is provided a system for measuring electrostatic discharge (ESD) characteristics of a semiconductor device that comprises at least one pulse generator generating ESD-scale pulses, a first point of the semiconductor device receiving a first ESD-scale pulse from the at least one pulse generator, a second point of the semiconductor device receiving the first ESD-scale pulse from the at least one pulse generator, at least a third point of the semiconductor device receiving a second ESD-scale pulse from the at least one pulse generator, and a data collector to collect data on the ESD characteristics of the semiconductor device.

Also in accordance with the present invention, there is provided a system for measuring electrostatic discharge (ESD) characteristics of a multi-terminal device that comprises a first pulse generator providing a first ESD-scale pulse, a second pulse generator providing a second ESD-scale pulse, a first terminal of the multi-terminal device coupled to the first pulse generator to receive the first ESD-scale pulse, a second terminal of the multi-terminal device coupled to the first pulse generator to receive the first ESD-scale pulse, a third terminal of the multi-terminal device coupled to the second pulse generator to receive the second ESD-scale pulse, and a detector to detect a leakage current of the multi-terminal semiconductor device, wherein the ESD characteristics of the multi-terminal device are determined when the detector detects a leakage current in the multi-terminal device.

Still in accordance with the present invention, there is provided a method of measuring electrostatic discharge (ESD) characteristics of a semiconductor device that comprises providing at least one pulse generator generating ESD-scale signals, identifying a first point on the semiconductor device, identifying a second point on the semiconductor device, identifying a third point on the semiconductor device, providing a first ESD-scale signal to the first and second points of the semiconductor device, and providing a second ESD-scale signal to at least the third point on the semiconductor device.

Yet still in accordance with the present invention, there is provided a method of electrostatic discharge (ESD) testing that comprises providing a multi-terminal device, generating at least one ESD-scale pulses, providing a first ESD-scale pulse of the at least one ESD-scale pulses to a first and a second terminals of the multi-terminal device, providing a second ESD-scale pulse of the at least one ESD-scale pulses to at least a third terminal of the multi-terminal device, collecting ESD characteristics of the multi-terminal device under the first and second ESD-scale pulses, and detecting if a leakage current flows in the multi-terminal semiconductor device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

Figure 2:
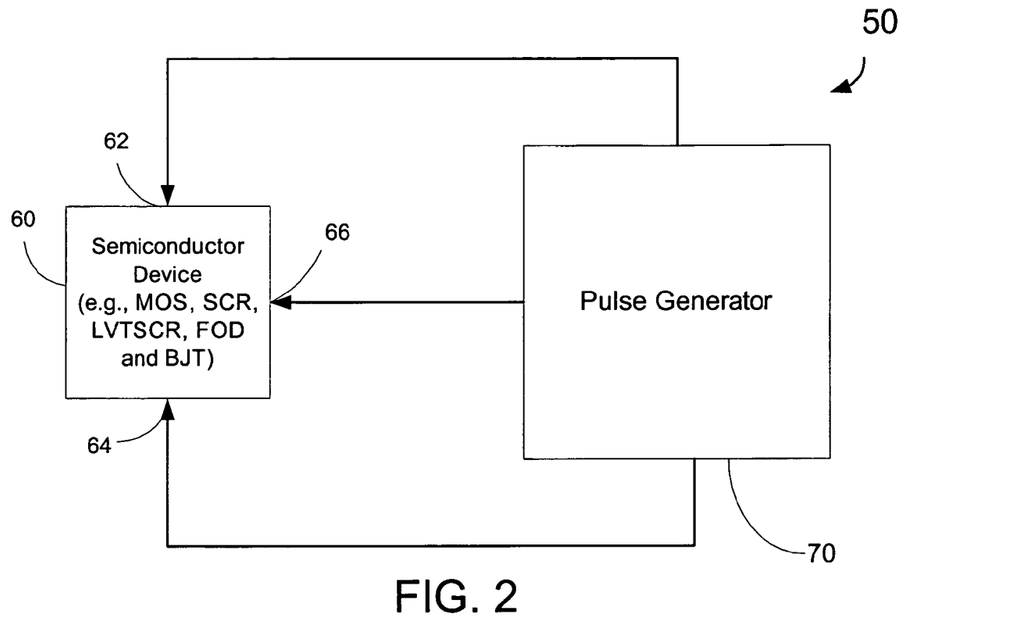
FIG. 2 is a schematic diagram of a system for measuring ESD characteristics of a semiconductor device in accordance with one embodiment of the present invention.

FIG. 2 is a schematic diagram of a system 50 for measuring ESD characteristics of a semiconductor device 60 in accordance with one embodiment of the present invention. Referring to FIG. 2, system 50 includes semiconductor device 60 and at least one pulse generator 70. Semiconductor device 60 is a multi-terminal device that includes at least a first terminal 62, second terminal 64 and third terminal 66. In one embodiment, semiconductor device 60 includes one metal-oxide-semiconductor (MOS) transistor, silicon-controlled rectifier (SCR), low voltage triggered SCR (LVTSCR), field oxide device (FOD), or bipolar junction transistor (BJT). Pulse generator 70 generates a signal that imitates an ESD event. For example, pulse generator 70 generates a signal of square pulses having the same rise time, duration, and magnitude as an ESD current or voltage. In one embodiment, the ESD-scale signal provided by pulse generator 70 has a time width of approximately 2 nanoseconds (ns) to 500 ns.

Specifically, pulse generator 70 may be implemented with a transmission line pulse ("TLP") generator described by T. J. Maloney and N. Khurana of Intel Corporation in a paper delivered at a 1985 ESD Symposium, entitled "Transmission Line Pulsing Techniques for Circuit Modeling". The paper is expressly incorporated herein by reference.

Figure 5:
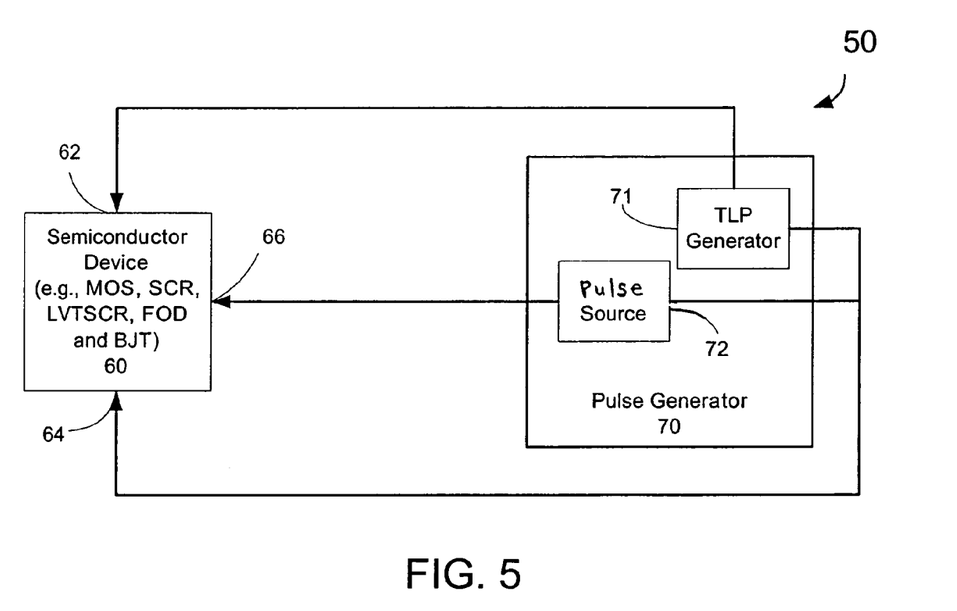
FIG. 5 is a detailed illustration of FIG. 2.

FIG. 5 shows one embodiment of the present invention, wherein a pulse generator 70 includes a TLP generator 71 and a pulse source 72. The TLP generator provides a first ESD-scale pulse to first terminal 62 and a second terminal 64 of semiconductor device 60. The pulse source 72 provides a second ESD-scale pulse to a second terminal 64 and a third terminal 66 of semiconductor device 60. In an embodiment wherein semiconductor device 60 is a MOS transistor, first terminal 62 and second terminal 64 are respectively a drain and a source of the MOS transistor, and third terminal 66 is the gate or substrate of the MOS transistor. In an embodiment wherein semiconductor device 60 is a SCR or LVTSCR, first terminal 62 and second terminal 64 are respectively an anode and a cathode of the SCR or LVTSCR, and third terminal 66 is the substrate or semiconductor well region of the SCR or LVTSCR. In an embodiment wherein semiconductor device 60 is a BJT or FOD, first terminal 62 and second terminal 64 are respectively a collector and an emitter of the BJT or FOD, and third terminal 66 is a base of the BJT or FOD.

In another embodiment consistent with the present invention, the pulse source 72 provides the second ESD-scale pulse to both a third and a fourth terminals of semiconductor device 60. In the embodiment in which the ESD protection device is a MOS transistor, the second ESD-scale pulse is provided to the gate and substrate of the MOS transistor. In the embodiment in which the ESD protection device is SCR or LVTSCR, the second ESD-scale pulse is provided to a substrate and a semiconductor well region of the SCR or LVTSCR.

In still another embodiment, the biasing pulse source 72 provides the second ESD-scale pulse to a fifth terminal of semiconductor device 60. In the embodiment in which the ESD protection device is a LVTSCR, the second ESD-scale pulse is provided to a gate of a parasitic MOS transistor formed in the LVTSCR.

Figure 3:
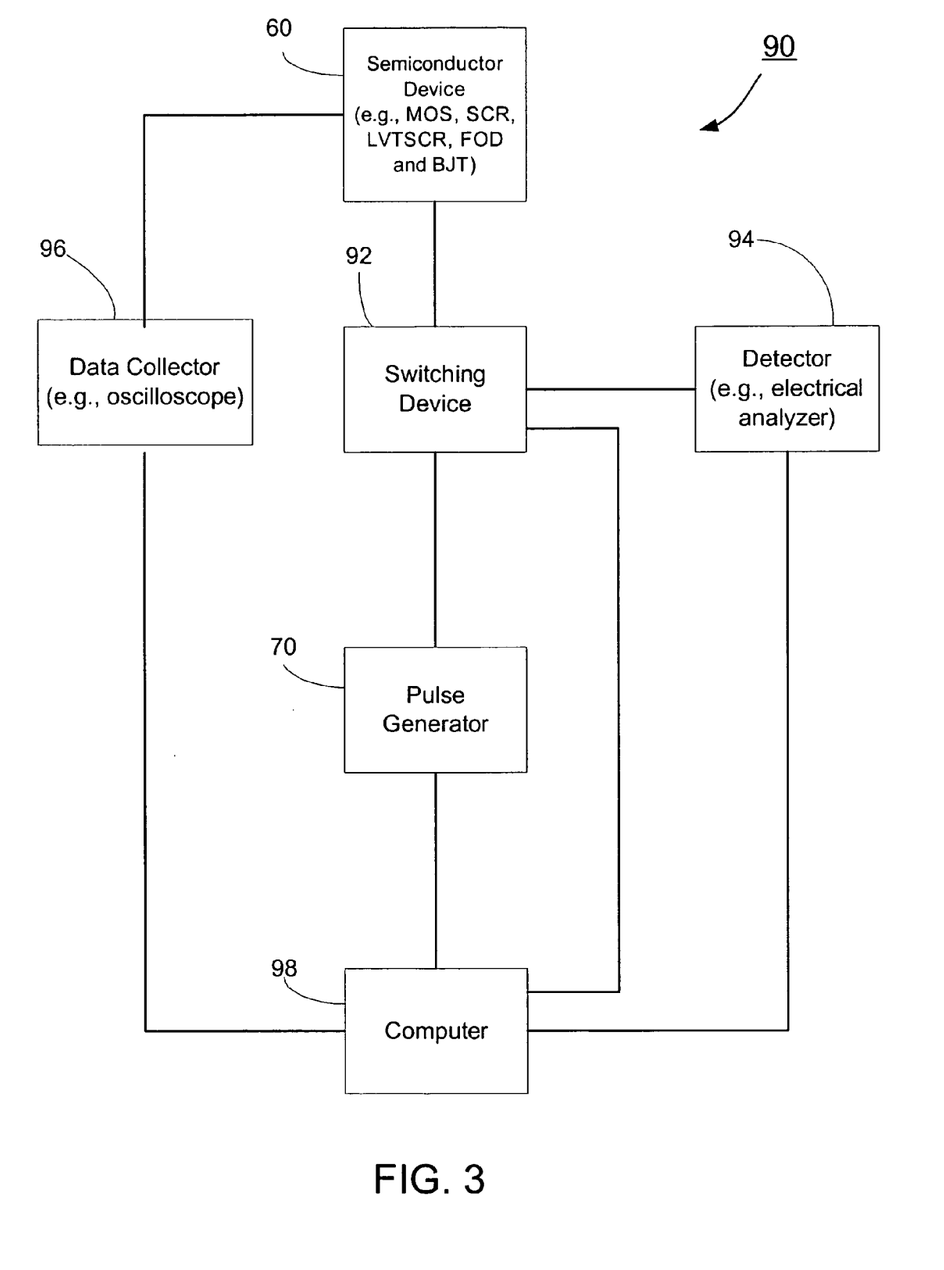
FIG. 3 is a schematic block diagram of a system for measuring ESD characteristics of a semiconductor device in accordance with another embodiment of the present invention.
Figure 6:
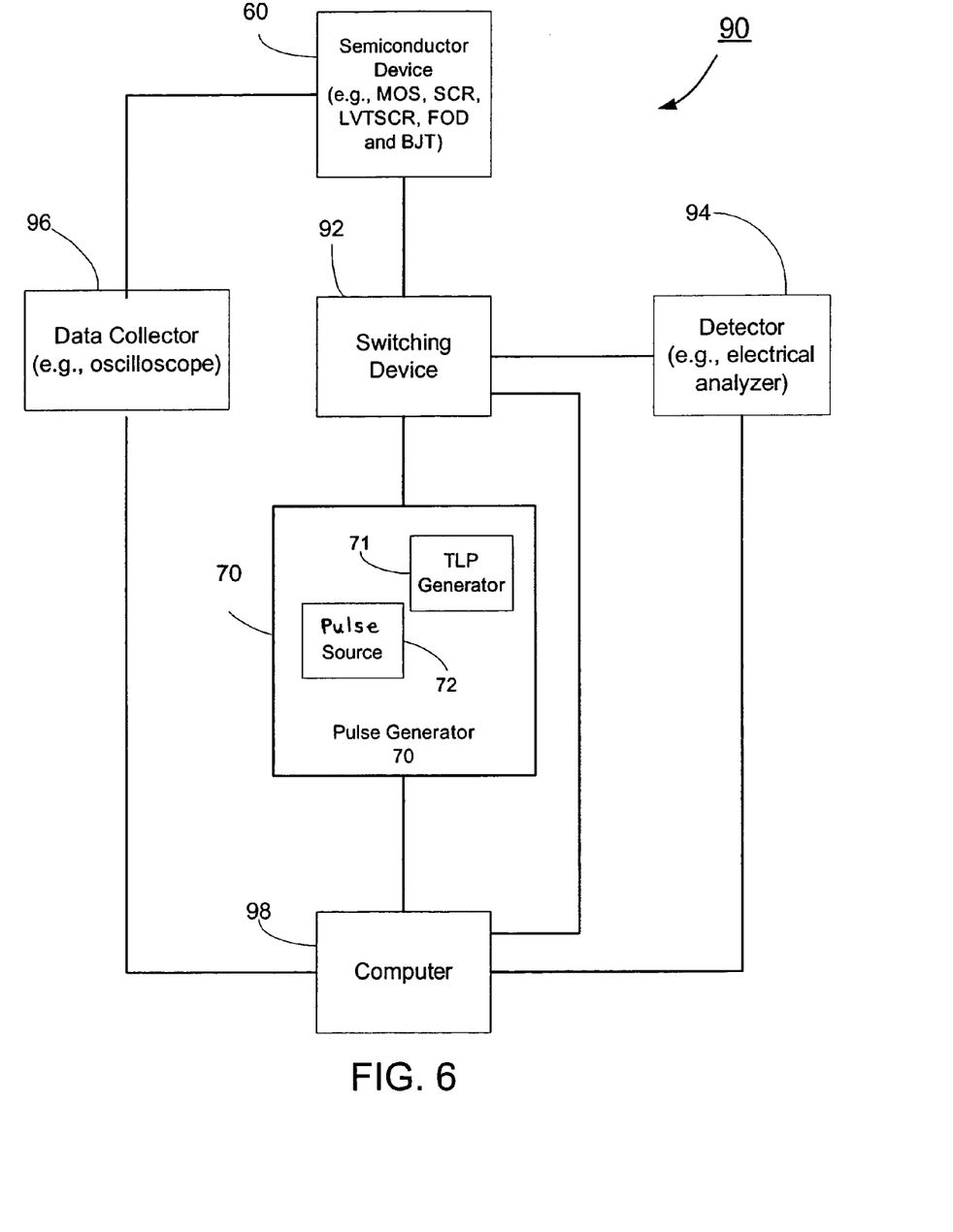
FIG. 6 is a detailed illustration of FIG. 3.

FIG. 3 is a simplified schematic block diagram of a system 90 for measuring ESD characteristics of a semiconductor device 60 in accordance with another embodiment of the present invention. Referring to FIG. 6, system 90 includes semiconductor device 60, a switching device 92, pulse generator 70, a detector 94, a data collector 96 and a computer 98. In one embodiment, switching device 92 is a switching matrix that switches a connection to semiconductor device 60 between detector 94 and pulse generator 70. Detector 94 includes an electrical analyzer such as the HP 4155 analyzer manufactured by Hewlett Packard Company. When detector 94 is electrically connected to semiconductor device 60 by switching device 92, detector 94 provides a signal, for example, a direct current (DC) signal, to semiconductor device 60 to detect whether a leakage current flows in semiconductor device 60. If detector 94 detects a leakage current, semiconductor device 60 is determined as having failed. If no leakage current is detected, pulse generator 70 switches to semiconductor device 60 for subsequent measurements.

Data collector 96, for example, an oscilloscope, collects voltage and current data regarding ESD characteristics of semiconductor device 60. Computer 98 coordinates operation among the pulse generator 70, data collector 96, and detector 94. In the particular embodiment shown in FIG. 6, data collector 96 is electrically connected to semiconductor device 60. In another embodiment, data collector 96 is electrically connected to a point between semiconductor device 60 and switching device 92.

The present invention therefore also provides a method of measuring electrostatic discharge (ESD) characteristics of semiconductor device 60. Referring again to FIG. 2, pulse generator 70 is provided to generate ESD-scale signals. A first ESD-scale signal is provided to first point 62 and second point 64 of semiconductor device 60. A second ESD-scale signal is provided to a third point 66 of semiconductor device 60. In one embodiment, the second ESD-scale signal is provided to at least one of a third and a fourth points of semiconductor device 60. In another embodiment, the second ESD-scale signal is provided to a fifth point of semiconductor device 60.

Figure 4:
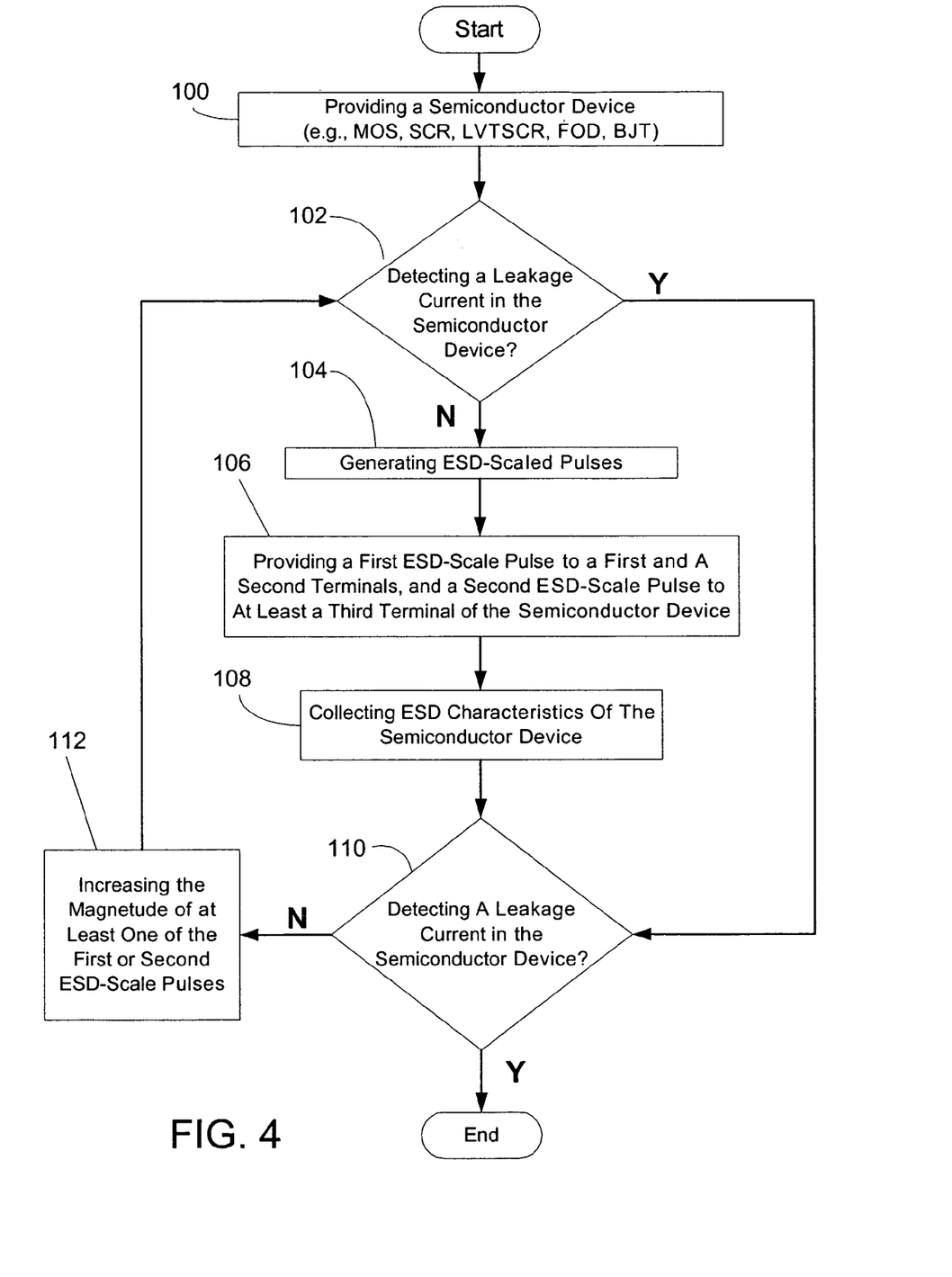
FIG. 4 is a flow diagram of a method in accordance with one embodiment of the present invention.

FIG. 4 is a flow diagram of a method in accordance with one embodiment of the present invention. Referring to FIG. 4, at step 100, a semiconductor device 60 having at least a first terminal, a second terminal, and a third terminal is provided. Semiconductor device 60 is then detected to determine whether a leakage current flows therein at step 102. If a leakage current is detected, semiconductor device 60 is determined as having failed and the method of the present invention proceeds no further.

If, however, no leakage current is detected, ESD-scale pulses are generated at step 104. At step 106, a first ESD-scale pulse is provided to the first terminal and second terminal of semiconductor device 60, and a second ESD-scale pulse is provided to at least the third terminal of semiconductor device 60. In one embodiment, the first and second ESD-scale pulses are generated by a TLP pulse generator. In another embodiment, the first ESD-scale pulse is generated by a TLP pulse generator, and the second ESD-scale pulse is generated by a pulse source 72. Also consistent with the present invention, an embodiment of the present invention includes, at step 106, the second ESD-scale pulse is provided to the third terminal before the first ESD-scale pulse is provided to the first terminal and the second terminal, assisting in the determination of a point of operation of semiconductor device 60. In still another embodiment, at step 106, the second ESD-scale pulse is provided to the third terminal approximately at the same time as the first ESD-scale pulse is provided to the first terminal and the second terminal.

ESD characteristics such as voltage and current data of semiconductor device 60 under ESD-scale pulses are then collected at step 108. Next, semiconductor device 60 is detected to determine whether a leakage current flows therein at step 110. If a leakage current is detected, the method of the present invention proceeds no further. If no leakage current is detected, the magnitude of at least one of the first and second ESD-scale pulses is increased at step 112. The higher-level ESD-scale pulses are then generated for subsequent measurements. Steps 104, 106, 108 and 112 are repeated until a leakage current is detected in semiconductor device 60 so that its ESD characteristics may be measured.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system for measuring electrostatic discharge (ESD) characteristics of a semiconductor device, comprising:
    at least one pulse generator generating ESD-scale pulses;
    a first point of the semiconductor device receiving a first ESD-scale pulse from the at least one pulse generator;
    a second point of the semiconductor device receiving the first ESD-scale pulse from the at least one pulse generator;
    at least a third point of the semiconductor device receiving a second ESD-scale pulse from the at least one pulse generator, wherein the second ESD-scale pulse is provided to the third point of the semiconductor device approximately at the same time as the first ESD-scale pulse is provided to the first and second point of the semiconductor device; and
    a data collector to collect data on the ESD characteristics of the semiconductor device.

2. The system of claim 1, wherein the semiconductor device includes one of a metal-oxide-semiconductor (MOS) transistor, a silicon-controlled rectifier (SCR), a low voltage triggered SCR (LVTSCR), a field oxide device (FOD) and a bipolar junction transistor (BJT).

3. The system of claim 2, wherein the MOS transistor includes a source and a drain to receive the first ESD-scale pulse, and at least one of a gate and a substrate to receive the second ESD-scale pulse.

4. The system of claim 2, wherein one of the SCR and LVTSCR includes an anode and a cathode to receive the first ESD-scale pulses, and at least one of a substrate and a semiconductor well region to receive the second ESD-scale pulse.

5. The system of claim 2, wherein the LVTSCR includes a gate to receive the second ESD-scale pulse.

6. The system of claim 2, wherein one of the FOD and BJT includes an emitter and a collector to receive the first ESD-scale pulses, and a base to receive the second ESD-scale pulse.

7. The system of claim 1, wherein the at least one pulse generator includes a transmission line pulse (TLP) generator to generate the ESD-scale pulses.

8. The system of claim 1, wherein the at least one pulse generator includes a transmission line pulse (TLP) generator to generate the first ESD-scale pulse.

9. The system of claim 1, wherein the at least one pulse generator includes a pulse source to generate the second ESD-scale pulse.

10. The system of claim 1, further comprising a detector to detect a leakage current in the semiconductor device.

11. The system of claim 1, further comprising a switching device coupled to the at least one pulse generator and the detector to switch a connection between the at least one pulse generator and the detector.

12. A system for measuring electrostatic discharge (ESD) characteristics of a multi-terminal device, comprising:
a pulse generator including:
means for generating a first pulse, the first pulse providing a first ESD-scale pulse;
means for generating a second pulse, the second pulse providing a second ESD-scale pulse;
a first terminal of the multi-terminal device coupled to the means for generating a first pulse to receive the first ESD-scale pulse;
a second terminal of the multi-terminal device coupled to the means for generating a first pulse to receive the first ESD-scale pulse;
a third terminal of the multi-terminal device coupled to the means for generating a second pulse to receive the second ESD-scale pulse, wherein the second ESD-scale pulse is provided to the third terminal approximately at the same time as the first ESD-scale pulse is provided to the first and the second terminal; and
a detector to detect a leakage current of the multi-terminal device, wherein the ESD characteristics of the multi-terminal device are determined when the detector detects a leakage current in the multi-terminal device.

13. The system of claim 12, wherein the pulse generator includes a transmission line pulse (TLP) generator generating the first and second ESD-scale pulses.

14. The system of claim 12, wherein the means for generating a first pulse is a TLP generator.

15. The system of claim 12, wherein the means for generating a second pulse is a pulse source.

16. The system of claim 12, further comprising a switching device coupled to the pulse generator and the detector to switch a connection to the multi-terminal device between the pulse generator and the detector.

17. The system of claim 12, wherein the multi-terminal device includes one of a metal-oxide-semiconductor (MOS) transistor, a silicon-controlled rectifier (SCR), a low voltage triggered SCR (LVTSCR), a field oxide device (FOD) and a bipolar junction transistor (BJT).

18. A method of measuring electrostatic discharge (ESD) characteristics of a semiconductor device, comprising:
providing at least one pulse generator generating ESD-scale signals;
identifying a first point on the semiconductor device;
identifying a second point on the semiconductor device;
identifying a third point on the semiconductor device;
providing a first ESD-scale signal to the first and second points of the semiconductor device; and
providing a second ESD-scale signal to at least the third point on the semiconductor device,
wherein the second ESD-scale signal is provided to the third point of the semiconductor device approximately at the same time as the first ESD-scale signal is provided to the first point and the second point of the semiconductor device.

19. The method of claim 18, further comprising the step of providing a transmission line pulse (TLP) generator to generate the first and second ESD-scale signals.

20. The method of claim 18, further comprising the step of providing a TLP generator to generate the first ESD-scale signal.

21. The method of claim 18, further comprising the step of providing a pulse source to generate the second ESD-scale signal.

22. The method of claim 18, further comprising the step of providing one of a metal-oxide-semiconductor (MOS) transistor, a silicon-controlled rectifier (SCR), a low voltage triggered SCR (LVTSCR), a field oxide device (FOD) and a bipolar junction transistor (BJT) to serve as the semiconductor device.

23. The method of claim 22, further comprising the step of providing the first ESD-scale signal to a source and a drain of the MOS transistor, and providing the second ESD-scale signal to at least one of a gate and a substrate of the MOS transistor.

24. The method of claim 22, further comprising the step of providing the first ESD-scale signal to an anode and a cathode of the SCR, and providing the second ESD-scale signal to at least one of a substrate and a semiconductor well region of the SCR.

25. The method of claim 22, further comprising the step of providing the first ESD-scale signal to an anode and a cathode of the LVTSCR, and providing the second ESD-scale signal to at least one of a substrate and a semiconductor well region of the LVTSCR.

26. The method of claim 22, further comprising the step of providing the first ESD-scale signal to an emitter and a collector of the FOD, and providing the second ESD-scale signal to a base of the FOD.

27. The method of claim 22, further comprising the step of providing the first ESD-scale signal to an emitter and a collector of the BJT, and providing the second ESD-scale signal to a base of the BJT.

28. The method of claim 18, further comprising the step of providing a data collector to collect data regarding the ESD characteristics of the semiconductor device.

29. The method of claim 18, further comprising the step of providing a detector to detect a leakage current in the semiconductor device.

30. The method of claim 18, further comprising the step of providing a switching device coupled to the at least one pulse generator and the detector to switch a connection to the semiconductor device between the at least one pulse generator and the detector.

31. A method of electrostatic discharge (ESD) testing, comprising:
providing a multi-terminal semiconductor device;
generating at least two ESD-scale pulses;
providing a first ESD-scale pulse of the at least two ESD-scale pulses to a first and a second terminal of the multi-terminal device;
providing a second ESD-scale pulse of the at least two ESD-scale pulses to at least the second terminal and a third terminal of the multi-terminal device, wherein the second ESD-scale pulse is provided to the third terminal approximately at the same time as the first ESD-scale pulse is provided to the first and the second terminal;
collecting ESD characteristics of the multi-terminal device under the first and second ESD-scale pulses; and
detecting if a leakage current flows in the multi-terminal semiconductor device.

32. The method of claim 31, further comprising the step of providing one of a metal-oxide-semiconductor (MOS) transistor, a silicon-controlled rectifier (SCR), a low voltage triggered SCR (LVTSCR), a field oxide device (FOD) and a bipolar junction transistor (BJT) to serve as the multi-terminal device.

33. The method of claim 31, further comprising the step of providing the second ESD-scale pulse to the at least one third terminal, before providing the first ESD-scale pulse to the first and second terminals.

34. The method of claim 31, further comprising the step of detecting whether a leakage current flows in the multi-terminal device before providing the first and second ESD-scale pulses.

35. The method of claim 34, further comprising generating the first and second ESD-scale pulses by a transmission line pulse (TLP) generator.

* * * * *